United States Patent
Abe

(10) Patent No.: US 12,342,660 B2
(45) Date of Patent: Jun. 24, 2025

(54) LIGHT EMITTING ELEMENT

(71) Applicant: NICHIA CORPORATION, Anan (JP)

(72) Inventor: Makoto Abe, Tokushima (JP)

(73) Assignee: NICHIA CORPORATION, Anan (JP)

( * ) Notice: Subject to any disclaimer, the term of this patent is extended or adjusted under 35 U.S.C. 154(b) by 423 days.

(21) Appl. No.: 18/055,038

(22) Filed: Nov. 14, 2022

(65) Prior Publication Data

US 2023/0163236 A1 May 25, 2023

(30) Foreign Application Priority Data

Nov. 22, 2021 (JP) .................. 2021-189590

(51) Int. Cl.
*H10H 20/812* (2025.01)
*H10H 20/825* (2025.01)

(52) U.S. Cl.
CPC ........ *H10H 20/812* (2025.01); *H10H 20/825* (2025.01)

(58) Field of Classification Search
None
See application file for complete search history.

(56) References Cited

U.S. PATENT DOCUMENTS

| | | |
|---|---|---|
| 2003/0001161 A1 | 1/2003 | Ota et al. |
| 2004/0066816 A1 | 4/2004 | Collins et al. |
| 2008/0217632 A1 | 9/2008 | Tomiya et al. |
| 2013/0260541 A1 | 10/2013 | Okuno et al. |
| 2016/0111594 A1* | 4/2016 | Nagel ............ H10H 20/812 257/13 |
| 2021/0202790 A1 | 7/2021 | Hayashi |
| 2021/0305451 A1 | 9/2021 | Kishino |

FOREIGN PATENT DOCUMENTS

| | | |
|---|---|---|
| JP | 2002-368269 A | 12/2002 |
| JP | 2004-128502 A | 4/2004 |
| JP | 2011-054982 A | 3/2011 |
| JP | 2013-207257 A | 10/2013 |
| JP | 2016-149399 A | 8/2016 |
| JP | 2017-157667 A | 9/2017 |
| JP | 2021-106245 A | 7/2021 |
| JP | 2021-158291 A | 10/2021 |

* cited by examiner

*Primary Examiner* — Kyoung Lee
(74) *Attorney, Agent, or Firm* — Foley & Lardner LLP

(57) ABSTRACT

A light emitting element includes a first light emitting part having a first active layer, a tunnel junction part, and a second light emitting part having a second active layer. The first active layer includes a plurality of first well layers, and a first barrier layer positioned between two adjacent first well layers among the first well layers. The second active layer includes a plurality of second well layers, and a second barrier layer positioned between two adjacent second well layers among the second well layers. The second barrier layer includes a nitride semiconductor layer that contains aluminum and gallium, and has an aluminum composition ratio higher than an aluminum composition ratio of the first barrier layer. An aluminum composition ratio peak of the second barrier layer is located on a first light emitting part side of the second barrier layer.

20 Claims, 7 Drawing Sheets

LIGHT EMITTING ELEMENT

CROSS-REFERENCE TO RELATED APPLICATIONS

This application is based upon and claims priority to Japanese Patent Application No. 2021-189590, filed on Nov. 22, 2021. The entire contents of these applications are incorporated herein by reference.

FIELD

The present disclosure relates to a light emitting element.

BACKGROUND

Japanese Patent Publication No. 2017-157667, for example, discloses a light emitting element that comprises nitride semiconductor layers including a tunnel junction layer.

SUMMARY

For a light emitting element that comprises nitride semiconductor layers including a tunnel junction layer, there is a need to improve the emission efficiency. An object of the present invention is to provide a light emitting element with improved emission efficiency.

According to an embodiment of the present disclosure, a light emitting element includes, successively from a lower side to an upper side, a first light emitting part having a first active layer, a tunnel junction part, and a second light emitting part having a second active layer. The first active layer includes a plurality of first well layers, and a first barrier layer positioned between two adjacent first well layers among the first well layers and having a larger band gap than the band gaps of the first well layers. The second active layer includes a plurality of second well layers, and a second barrier layer positioned between two adjacent second well layers among the second well layers and having a larger band gap than the band gaps of the second well layers. The second barrier layer includes a nitride semiconductor layer containing aluminum and gallium and having a higher aluminum composition ratio than the aluminum composition ratio of the first barrier layer. The aluminum composition ratio peak of the second barrier layer is located on the first light emitting part side.

According to certain embodiments of the present disclosure, a light emitting element with improved emission efficiency can be provided.

DETAILED DESCRIPTION

Figure 1:
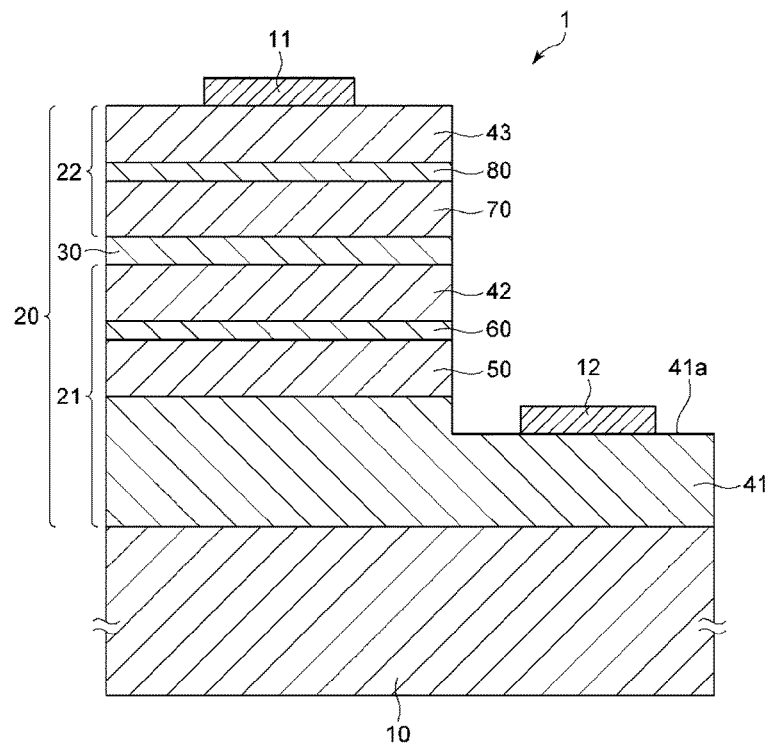
FIG. 1 is a cross-sectional view of a light emitting element according to a first embodiment.

Embodiments of the present disclosure will be explained below with reference to the accompanying drawings. In the drawings, the same reference numerals are used to denote the same constituents. The drawings are schematic representations of the embodiments. As such, the scale, spacing, or positional relationships of the members might be exaggerated, or a certain portion of a member omitted. An end face view showing only a cut section might be used as a cross-sectional view.

First Embodiment

FIG. 1 is a cross-sectional view of a light emitting element 1 according to a first embodiment.

The light emitting element 1 has a substrate 10, a semiconductor structure 20, a p-side electrode 11, and an n-side electrode 12.

A substrate 10 supports a semiconductor structure 20. For the material for the substrate 10, for example, sapphire, silicon, SiC, GaN, or the like can be used. In the case of using a sapphire substrate as the substrate 10, the semiconductor structure 20 is disposed on C-plane of the sapphire structure 20.

A semiconductor structure 20 is a stack structure in which a plurality of nitride semiconductor layers are stacked. Nitride semiconductors can include all semiconductors obtained by varying the composition ratio x and y within their ranges in the chemical formula $In_xAl_yGa_{1-x-y}N$ ($0 \leq x \leq 1$, $0 \leq y \leq 1$, $x+y \leq 1$). For example, the semiconductor structure 20 can be epitaxially grown on the substrate 10.

In the present specification, the lower side is closer to the substrate 10 relative to the upper side. A semiconductor structure 20 includes, successively from the lower side to the upper side, a first light emitting part 21, a tunnel junction part 30, and a second light emitting part 22.

A first light emitting part 21 has an n-side nitride semiconductor layer 41 positioned on the substrate 10, a first superlattice layer 50 positioned on the n-side nitride semiconductor layer 41, a first active layer 60 positioned on the first superlattice layer 50, and a first p-side nitride semiconductor layer 42 positioned on the first active layer 60.

A second light emitting part 22 has a second superlattice layer 70 positioned on a tunnel junction part 30, a second active layer 80 positioned on the second superlattice layer 70, and a second p-side nitride semiconductor layer 43 positioned on the second active layer 80.

An n-side nitride semiconductor layer 41 has an n-type layer containing an n-type impurity. The n-type layer contains, for example, silicon (Si) as an n-type impurity. Alternatively, the n-type layer may contain germanium (Ge) as an n-type impurity. The n-side nitride semiconductor layer 41 only needs to have the function of supplying electrons, and may include an undoped layer formed without intentionally doping with an n-type impurity or a p-type impurity. In the case in which an undoped layer is adjacent to a layer intentionally doped with an n-type impurity and/or a p-type impurity, the undoped layer might contain the n-type impurity and/or the p-type impurity diffused from the adjacent layer.

A first p-side nitride semiconductor layer 42 and a second p-side nitride semiconductor layer 43 each have a p-type layer containing a p-type impurity. The p-type layer contains, for example, magnesium (Mg) as a p-type impurity. The first p-side nitride semiconductor layer 42 and the second p-side nitride semiconductor layer 43 only need to have the function of supplying positive holes, and may include an undoped layer.

A first active layer 60 and a second active layer 80, as described later, have a multi-quantum well structure having a plurality of well layers and a plurality of barrier layers. The first active layer 60 and the second active layer 80 can emit, for example, blue light or green light. The peak emission wavelength of blue light is 430 nm to 490 nm. The peak emission wavelength of green light is 500 nm to 540 nm. The peak emission wavelength of the first active layer 60 and the peak emission wavelength of the second active layer 80 may be the same or different. The first active layer 60 and the second active layer 80 can emit light having a shorter peak emission wavelength than that of blue light, or light having a longer peak emission wavelength than that of green light.

A tunnel junction part 30 is made of a nitride semiconductor. The tunnel junction part 30 forms a tunnel junction with the first p-side nitride semiconductor layer 42. The tunnel junction part 30 has at least one semiconductor layer of a p-type layer and a n-type layer. The p-type layer is disposed in contact with the upper face of the first p-side nitride semiconductor layer 42. The n-type layer, if a p-type layer is disposed, is disposed in contact with the upper face of the p-type layer. If no p-type layer is disposed, the n-type layer is disposed in contact with the upper face of the first p-side nitride semiconductor layer 42.

A first superlattice layer 50 is positioned between the n-side nitride semiconductor layer 41 and the first active layer 60. A second superlattice layer 70 is positioned between the tunnel junction part 30 and the second active layer 80. Providing a first superlattice layer 50 and a second superlattice layer 70 can reduce lattice mismatch between the substrate 10 and the semiconductor structure 20, thereby reducing crystal defects in the semiconductor structure 20.

The n-side nitride semiconductor layer 41 has an n-side contact face 41a on which no semiconductor layer is disposed. On the n-side contact face 41a, an n-side electrode 12 is disposed. The n-side electrode 12 is electrically connected to the n-side nitride semiconductor layer 41.

On the upper face of the second p-side nitride semiconductor 43, a p-side electrode 11 is disposed. The p-side electrode 11 is electrically connected to the second p-side nitride semiconductor layer 43.

A forward voltage is applied across the p-side electrode 11 and the n-side electrode 12. At this time, a forward voltage is applied across the second p-side nitride semiconductor layer 43 of the second light emitting part 22 and the n-side nitride semiconductor layer 41 of the first light emitting part 21, supplying positive holes and electrons to the first active layer 60 and the second active layer 80 thereby allowing the first active layer 60 and the second active layer 80 to emit light.

According to a light emitting element 1 of the first embodiment, in which a second active layer 80 is provided above a first active layer 60, the per unit area output can be increased as compared to a light emitting element having a single active layer.

When a forward voltage is applied across the p-side electrode 11 and the n-side electrode 12, a reverse voltage would be applied to the tunnel junction formed by the tunnel junction part 30 and the first p-side nitride semiconductor layer 42. Accordingly, allowing the p-type layer and the n-type layer that form the tunnel junction to respectively have high p-type and n-type impurity concentrations can narrow the width of the depletion layer formed by the junction between the tunnel junction part 30 and the first p-side nitride semiconductor layer 42. This allows for the tunneling of the electrons present in the valence band in the p-type layer to the conduction band of the n-type layer to thereby facilitate the electric current flow to the tunnel junction part 30.

The first superlattice layer 50, the first active layer 60, the second superlattice layer 70, and the second active layer 80 will be explained in detail below.

First Superlattice Layer

Figure 2:
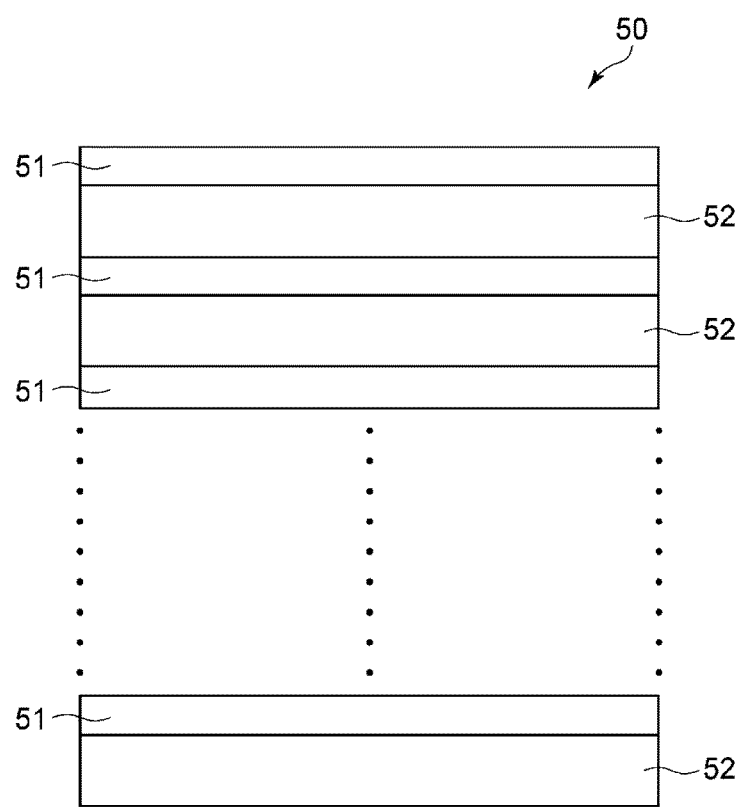
FIG. 2 is a cross-sectional view of a first superlattice layer according to the first embodiment.

As shown in FIG. 2, a first superlattice layer 50 has a plurality of first nitride semiconductor layers 51 and a plurality of second nitride semiconductor layers 52. The first superlattice layer 50 can have, for example, 15 to 25 pairs of a first nitride semiconductor layer 51 and a second nitride semiconductor layer 52. The first superlattice layer 50 can have, for example, twenty first nitride semiconductor layers 51 and twenty second nitride semiconductor layers 52. In the first superlattice layer 50, a second nitride semiconductor layer 52 is in the lowest position (the lowermost layer), and a first nitride semiconductor layer 51 is in the highest position (the uppermost layer). From the second nitride semiconductor layer 52, the lowermost layer, to the first nitride semiconductor layer 51, the uppermost layer, the second nitride semiconductor layers 52 and the first nitride semiconductor layers 51 are formed alternately.

The second nitride semiconductor layers 52 include a second nitride semiconductor layer 52 positioned between two adjacent first nitride semiconductor layers 51 among the first nitride semiconductor layers 51. A second nitride semiconductor layer 52 is also interposed between the lowermost first nitride semiconductor layer 51 and the n-side nitride semiconductor layer 41.

The first nitride semiconductor layers 51 and the second nitride semiconductor layers 52 contain gallium (Ga). The composition of a first nitride semiconductor layer 51 differs from the composition of a second nitride semiconductor layer 52. The first nitride semiconductor layers 51 can further contain indium (In). The first nitride semiconductor layers 51 are, for example, undoped InGaN layers. The In composition ratio in each InGaN layer can be set in a range of 5% to 10%. The second nitride semiconductor layers 52 are, for example, undoped GaN layers. The n-type impurity concentration of the first nitride semiconductor layers 51 and the second nitride semiconductor layers 52 can be set, for example, to $1\times10^{17}$ cm$^3$ to $1\times10^{18}$ cm$^3$. The n-type impurity concentration of the first nitride semiconductor layers 51 and the second nitride semiconductor layers 52 refers to the highest n-type impurity concentration among all concentrations in the first nitride semiconductor layers 51 and the second nitride semiconductor layers 52.

The first nitride semiconductor layers 51 are smaller in thickness than the second nitride semiconductor layers 52. For example, the thickness of each first nitride semiconductor layer 51 can be set in a range of 0.5 nm to 1.5 nm. For example, the thickness of each second nitride semiconductor layer 52 can be set in a range of 1.5 nm to 3 nm.

First Active Layer

Figure 3:
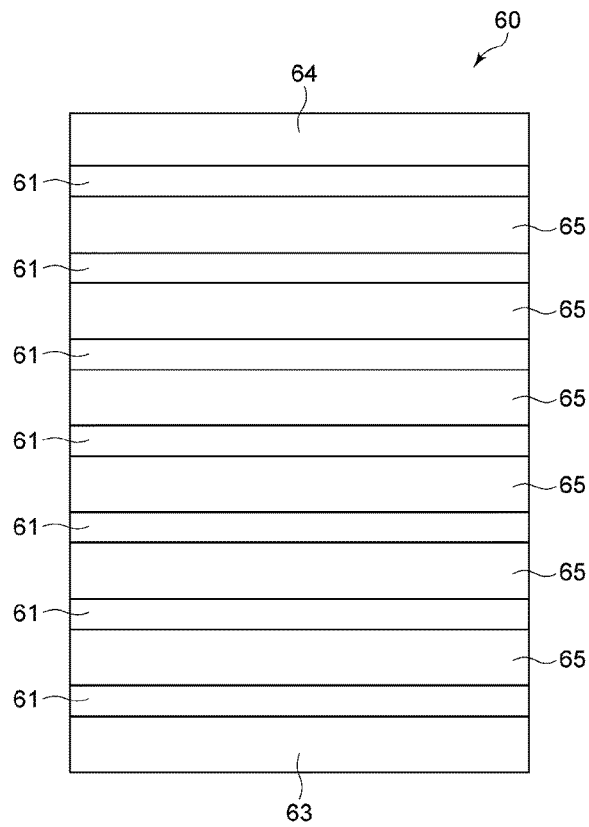
FIG. 3 is a cross-sectional view of a first active layer according to the first embodiment.

As shown in FIG. 3, a first active layer 60 has a plurality of first well layers 61 and at least one first barrier layer 65. The first active layer 60 has, for example, three or more first well layers 61 and two or more first barrier layers 65. The first active layer 60 can have, for example, seven first well layers 61 and six first barrier layers 65. Each first barrier layer 65 is positioned between two adjacent first well layers 61 among the first well layers 61. The first active layer 60 can further have a fourth barrier layer 63 in the lowest position in the first active layer 60 and a fifth barrier layer 64 in the highest position in the first active layer 60. A first well layer 61 is disposed between the fourth barrier layer 63 and the first barrier layer 65 that has the lowest position among the first barrier layers 65. A first well layer 61 is disposed between the fifth barrier layer 64 and the first barrier layer 65 that has the highest position among the first barrier layers 65. Between the fourth barrier layer 63 and the fifth barrier layer 64, the first well layers 61 and the first barrier layers 65 are alternately provided.

The band gaps of the first barrier layers 65, the fourth barrier layer 63, and the fifth barrier layer 64 are larger than the band gaps of the first well layers 61. The first well layers 61, the first barrier layers 65, the fourth barrier layer 63, and the fifth barrier layer 64 contain gallium. The first well layers 61 contain gallium and indium. For example, the first well layers 61 are undoped InGaN layers. In the case in which the first well layers 61 are InGaN layers, the In composition ratio can be set in a range of 12% to 18%. For example, the first barrier layers 65, the fourth barrier layer 63, and the fifth barrier layer 64 are undoped GaN layers. The first well layers 61 may contain aluminum.

The first barrier layers 65 and the fifth barrier layer 64 are larger in thickness than the first well layers 61. For example, the thickness of a first well layer 61 can be set in a range of 2.5 nm to 4 nm. For example, the thicknesses of the first barrier layers 65 and the fifth barrier layer 64 can be set in a range of 3 nm to 5 nm. The thickness of the fourth barrier layer 63 can be set in a range of 3 nm to 5 nm.

Second Superlattice Layer

Figure 4:
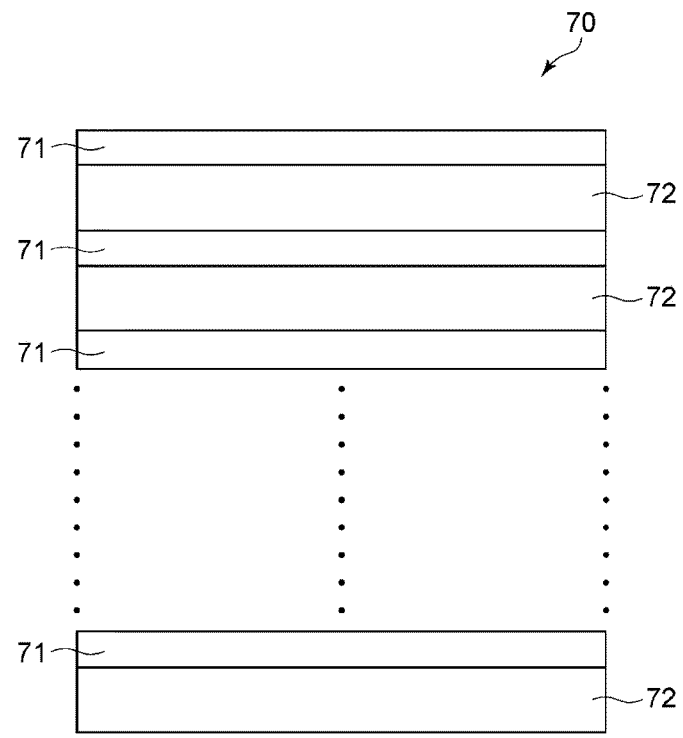
FIG. 4 is a cross-sectional view of a second superlattice layer according to the first embodiment.

As shown in FIG. 4, a second superlattice layer 70 has a plurality of third nitride semiconductor layers 71 and a plurality of fourth nitride semiconductor layers 72. The second superlattice layer 70 can have, for example, 15 to 25 pairs of a third nitride semiconductor layer 71 and a fourth nitride semiconductor layer 72. The second superlattice layer 70 can have, for example, twenty third nitride semiconductor layers 71 and twenty fourth nitride semiconductor layers 72. In the second superlattice layer 70, a fourth nitride semiconductor layer 72 is in the lowest position (the lowermost layer), and a third nitride semiconductor layer 71 is in the highest position (the uppermost layer). From the fourth nitride semiconductor layer 72, the lowermost layer, to the third nitride semiconductor layer 71, the uppermost layer, the fourth nitride semiconductor layers 72 and the third nitride semiconductor layers 71 are formed alternately.

The fourth nitride semiconductor layers 72 include a fourth nitride semiconductor layer 72 positioned between two adjacent third nitride semiconductor layers 71 among the third nitride semiconductor layers 71. A fourth nitride semiconductor layer 72 is also interposed between the lowermost third nitride semiconductor layer 71 and the tunnel junction part 30.

The third nitride semiconductor layers 71 and the fourth nitride semiconductor layers 72 contain gallium and an n-type impurity. The composition of a third nitride semiconductor layer 71 differs from the composition of a fourth nitride semiconductor layer 72. The third nitride semiconductor layers 71 can further contain indium. The third nitride semiconductor layers 71 are, for example, silicon-doped InGaN layers. In the case in which the third nitride semiconductor layers 71 are InGaN layers, the In composition ratio can be set in a range of 5% to 10%. The fourth nitride semiconductor layers 72 are, for example, silicon-doped GaN layers. The n-type impurity concentration of the third nitride semiconductor layers 71 and the fourth nitride semiconductor layers 72 can be set, for example, to $1 \times 10^{17}$ cm$^3$ to $1 \times 10^{20}$ cm$^3$. The n-type impurity concentration of the third nitride semiconductor layers 71 and the fourth nitride semiconductor layers 72 refers to the highest n-type impurity concentration among all concentrations in the third nitride semiconductor layers 71 and the fourth nitride semiconductor layers 72.

The third nitride semiconductor layers 71 are smaller in thickness than the fourth nitride semiconductor layers 72. For example, the thickness of a third nitride semiconductor layer 71 can be set in a range of 0.5 nm to 1.5 nm. For example, the thickness of a fourth nitride semiconductor layer 72 can be set in a range of 1.5 nm to 3 nm.

Second Active Layer

Figure 5:
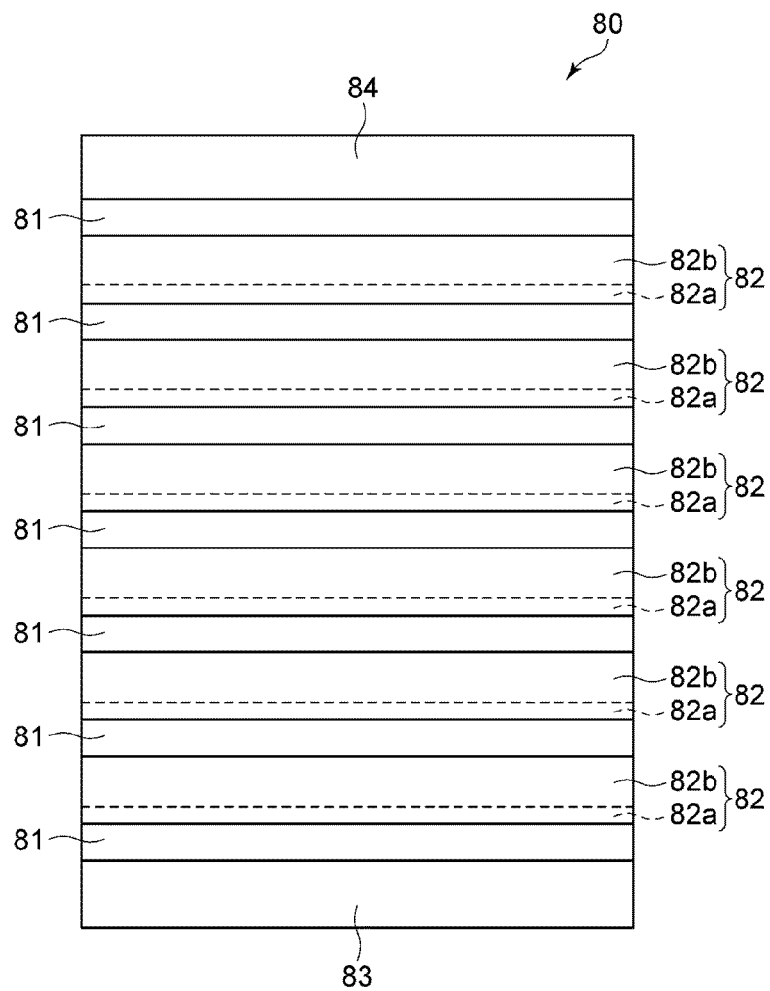
FIG. 5 is a cross-sectional view of a second active layer according to the first embodiment.

As shown in FIG. 5, a second active layer 80 has a plurality of second well layers 81 and at least one second barrier layer 82. The second active layer 80 has, for example, three or more second well layers 81 and two or more second barrier layers 82. The second active layer 80 can have, for example, seven second well layers 81 and six second barrier layers 82. Each second barrier layer 82 is positioned between two adjacent second well layers 81 among the second well layers 81.

The second active layer 80 can further have a sixth barrier layer 83 in the lowest position in the second active layer 80 and a third barrier layer 84 in the highest position in the second active layer 80. A second well layer 81 is disposed between the sixth barrier layer 83 and the second barrier layer 82 that has the lowest position among the second barrier layers 82. A second well layer 81 is disposed between the third barrier layer 84 and the second barrier layer 82 that has the highest position among the second barrier layers 82. Between the sixth barrier layer 83 and the third barrier layer 84, the second well layers 81 and the second barrier layers 82 are alternately provided.

The band gaps of the second barrier layers 82, the sixth barrier layer 83, and the third barrier layer 84 are larger than the band gaps of the second well layers 81. The second well layers 81, the second barrier layers 82, the sixth barrier layer 83, and the third barrier layer 84 are, for example, undoped nitride semiconductor layers.

The second well layers 81 contain gallium and indium. For example, the second well layers 81 are undoped InGaN layers. In the case in which the second well layers 81 are InGaN layers, the In composition ratio can be set in a range of 12% to 18%. The second well layers 81 may contain aluminum.

The second barrier layers 82 contain aluminum and gallium. The second barrier layers 82 include a nitride semiconductor layer having a higher aluminum composition ratio than the aluminum composition ratio of the first barrier layers 65 of the first active layer 60.

The aluminum composition ratio peak of at least one second barrier layer 82 is located on the first light emitting part 21 side. The aluminum composition ratio peak is preferably located on the first light emitting part 21 side in all second barrier layers 82.

At least one second barrier layer 82 has, successively from the first light emitting part 21 side, a first layer 82a and a second layer 82b. All second barrier layers 82 preferably have a first layer 82a and a second layer 82b. A second barrier layer 82 is formed by forming a first layer 82a, followed by forming a second layer 82b on the first layer 82a. For example, a second barrier layer 82 is formed by forming an undoped AlGaN layer as a first layer 82a, followed by forming on the first layer 82a an undoped GaN layer as a second layer 82b. The aluminum composition ratio of each first layer 82a is higher than the aluminum composition ratio of each second layer 82b. The aluminum composition ratio peak in a second barrier layer 82 is positioned in the first layer 82a. The aluminum composition ratio of a first layer 82a can be set in a range of 3% to 5%.

The third barrier layer 84 contains gallium. The aluminum composition ratio of the third barrier layer 84 is lower than the aluminum composition ratio of the second barrier layers 82. For example, the third barrier layer 84 is a GaN layer.

The sixth barrier layer 83 contains gallium. The aluminum composition ratio of the sixth barrier layer 83 is lower than the aluminum composition ratio of the second barrier layers 82. For example, the sixth barrier layer 83 is, for example, a GaN layer.

The second barrier layers 82 and the third barrier layer 84 are larger in thickness than the second well layers 81. For example, the thickness of a second well layer 81 can be set in a range of 2.5 nm to 4 nm. For example, the thicknesses of the second barrier layers 82 and the third barrier layer 84 can be set in a range of 3 nm to 5 nm. The thickness of the sixth barrier layer 83 can be set in a range of 3 nm to 5 nm.

The thickness of the first layer 82a of a second barrier layer 82 can be set in a range of 2% to 25% of the thickness of the second barrier layer 82. In other words, the thickness of the first layer 82a is smaller than the thickness of the second layer 82b. For example, the thickness of a first layer 82a is preferably set in a range of 0.1 nm to 1 nm, more preferably in a range of 0.5 nm to 1 nm. The thickness of a second layer 82b is more preferably set in a range of 0.5 nm to 4 nm.

In a light emitting element in which a second light emitting part is formed on a first light emitting part via a tunnel junction part, the crystalline quality and the flatness of the second light emitting part tend to worsen as compared to the first light emitting part. Particularly, the diameters of V-pits formed in the semiconductor layers originating from dislocations that are crystal defects readily become larger in the second light emitting part than in the first light emitting part. This reduces the region of the active layer in the second light emitting part that contributes to emission to thereby easily reduce the emission efficiency of the second light emitting part as compared to the first light emitting part. As a method for improving the flatness of the upper face of a semiconductor layer to be formed, the growth temperature for the semiconductor layer can be increased. However, raising the growth temperature for the semiconductor layer would allow for the diffusion of magnesium, for example, contained in a high p-type impurity concentration p-type layer disposed for forming a tunnel junction, which broadens the depletion layer formed in the tunnel junction part to reduce the tunneling probability.

According to the first embodiment, the second barrier layers 82 of the second active layer 80 of the second light emitting part 22 have a higher aluminum composition ratio than the first barrier layers 65 of the first active layer 60 of the first light emitting part 21, and the aluminum composition ratio peaks in the second barrier layers 82 are located on the first light emitting part 21 side. Aluminum is incorporated into V-pits with priority to initiate crystal growth in V-pits. This can readily fill V-pits thereby improving the flatness without having to increase the growth temperature. This, as a result, can increase the region of the second active layer 80 of the second light emitting part 22 that contributes to emission, thereby improving the emission efficiency of the light emitting element 1.

Increasing the aluminum composition ratio of the first barrier layers 62 in the first active layer 60 on the first light emitting part 21 side, which is less prone to flatness degradation than the second light emitting part 21 side, does not tend to lead to any increase in the emission efficiency of the light emitting element 1. This is believed to be because the flattening effect on the first barrier layers 65, although achieved to some extent, is less than that achieved on the second light emitting part 22 side, and the increased band gaps of the first barrier layers 65 reduce the emission efficiency.

If the aluminum composition ratio peaks in the second barrier layers 82 are located on the second p-side nitride semiconductor layer 43 side, instead of the first light emitting part 21 side, aluminum would mix into the second well layers 81 formed on the second barrier layers 82 to degrade the crystalline quality of the second well layers 81 that might reduce the output of the light emitting element 1. If the aluminum composition ratio peaks in the second barrier layers 82 are located on the second p-side nitride semiconductor layer 43 side, moreover, the internal electric field might have an adverse effect to reduce the efficiency of injecting electrons from the first light emitting part 21 into the second well layers 81.

Next, the forward voltage and light output measurement results of the samples of the light emitting element 1 according to the first embodiment will be explained. The thickness of the first layer 82a in each second barrier layer 82 that included a first layer 82a and a second layer 82b was varied among the samples to be 0.1 nm, 0.3 nm, 0.5 nm, and 1 nm, to measure their forward voltages and light outputs.

Each of the samples of the light emitting element 1 had the constituents described below.

The substrate 10 was a sapphire substrate.

The n-side nitride semiconductor layer 41 contained silicon as a n-type impurity. The silicon concentration of the n-side nitride semiconductor layer 41 was about $1 \times 10^{19}$ cm$^3$. The silicon concentration of the n-side nitride semiconductor layer 41 refers to the highest silicon concentration in the n-side nitride semiconductor layer 41. The thickness of the n-side nitride semiconductor layer 41 was about 5 μm.

The first superlattice layer 50 had twenty first nitride semiconductor layers 51 and twenty second nitride semiconductor layers 52. The first nitride semiconductor layers 51 were undoped InGaN layers. The In composition ratio of each InGaN layer was about 7%. The first nitride semiconductor layers 51 were about 1 nm in thickness. The second nitride semiconductor layers 52 were undoped GaN layers. The second nitride semiconductor layers 52 were about 2 nm in thickness.

The first active layer 60 had seven first well layers 61 and six first barrier layers 65. The first active layer 60 further had a fourth barrier layer 63 positioned lowest in the first active layer 60, and a fifth barrier layer 64 positioned highest in the first active layer 60. The first well layers 61 were undoped InGaN layers. The In composition ratio of each first well layers 61 was about 15%. The first well layers 61 were about 3.5 nm in thickness. The first barrier layers 65 were undoped GaN layers. The first barrier layers 65 were about 4 nm in thickness. The fourth barrier layer 63 included, successively from the first superlattice layer 50 side, a silicon-doped InGaN layer and an undoped GaN layer. The thickness of the fourth barrier layer 63 was about 3.5 nm. The fifth barrier layer 64 was an undoped GaN layer. The thickness of the fifth barrier layer 64 was about 4 nm.

The first p-side nitride semiconductor layer 42 contained magnesium as a p-type impurity. The magnesium concentration of the first p-side nitride semiconductor layer 42 was about $5 \times 10^{20}$ cm$^3$. The magnesium concentration of the first p-side nitride semiconductor 42 refers to the highest magnesium concentration in the first p-side nitride semiconductor layer 42. The thickness of the first p-side nitride semiconductor 42 was about 80 nm.

The tunnel junction part 30 included a silicon-doped n-type GaN layer. The silicon concentration of the n-type GaN layer was about $5 \times 10^{20}$ cm$^3$. The thickness of the n-type GaN layer was about 150 nm.

The second superlattice layer 70 had twenty third nitride semiconductor layers 71 and twenty fourth nitride semiconductor layers 72. The third nitride semiconductor layers 71 were silicon-doped InGaN layers. The In composition ratio of each third nitride semiconductor layer 71 was about 7%. The third nitride semiconductor layers 71 were about 1 nm in thickness. The fourth nitride semiconductor layers 72 were silicon-doped GaN layers. The fourth nitride semiconductor layers 72 were about 2 nm in thickness. The silicon concentration of the third nitride semiconductor layers 71 and the fourth nitride semiconductor layers 72 was about $1 \times 10^{19}$ cm$^3$.

The second active layer 80 had seven second well layers 81 and six second barrier layers 82. The second active layer 80 further had a sixth barrier layer 83 that was positioned lowest in the second active layer 80, and a third barrier layer 84 that was positioned highest in the second active layer 80. The second well layers 81 were undoped InGaN layers. The In composition ratio of each second well layer 81 was about 15%. The second well layer 81 were about 3.5 nm in thickness. Each second barrier layer 82 had a first layer 82a and a second layer 82b. The first layers 82a were undoped AlGaN layers. The Al composition ratio in each first layer 82a was about 4%. The second layers 82b were undoped GaN layers. The second barrier layers 82 were about 4 nm in thickness. The thickness of the first layer 82a in each second barrier layer 82 was varied among samples to be 0.1 nm, 0.3 nm, 0.5 nm, and 1 nm. The sixth barrier layer 83 included, successively from the second superlattice layer 70 side, a silicon-doped InGaN layer and an undoped GaN layer. The thickness of the sixth barrier layer 83 was about 3.5 nm. The third barrier layer 84 was an undoped GaN layer. The thickness of the third barrier layer 84 was about 4 nm.

The second p-side nitride semiconductor layer 43 contained magnesium as a p-type impurity. The magnesium concentration of the second p-side nitride semiconductor layer 43 was about $5 \times 10^{20}$ cm$^3$. The magnesium concentration of the second p-side nitride semiconductor layer 43 refers to the highest magnesium concentration in the second p-side nitride semiconductor layer 43. The thickness of the second p-side nitride semiconductor layer 43 was about 100 nm.

Figure 11A:
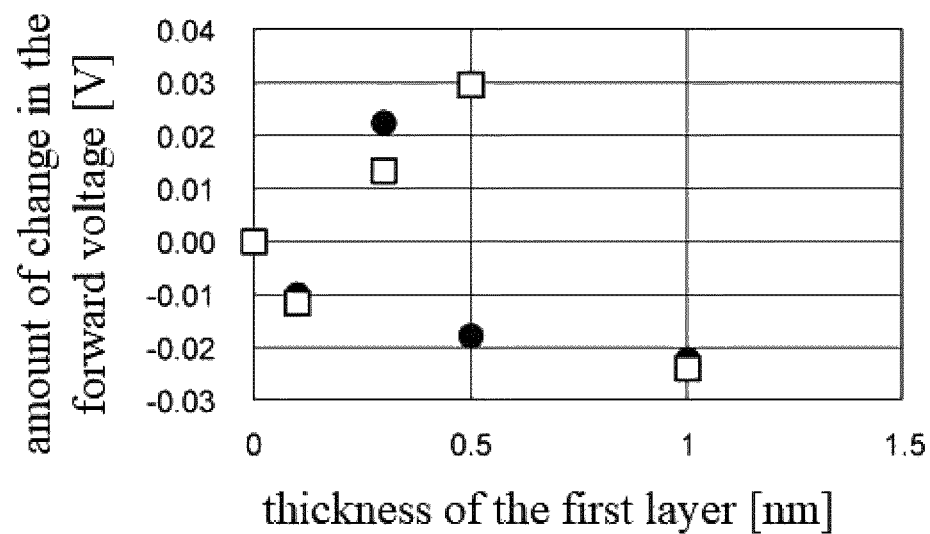
FIG. 11A is a graph showing the forward voltage measurement results of the light emitting elements according to the first embodiment.

FIG. 11A is a graph showing the forward voltage measurement results of the light emitting element 1 samples when the forward current applied was 120 mA. In FIG. 11A, the horizontal axis represents the thickness (nm) of the first layer 82a in a second barrier layer 82. In FIG. 11A, the vertical axis represents the amount of change in the forward voltage (V) as compared to the forward voltage (0.00 V) assumed in the case in which the thickness of a first layer 82a was zero. The thickness of a first layer 82a being zero is the case in which the second barrier layers 82 were composed only of GaN layers.

In FIG. 11A, black circles show the measurement results of the samples of the light emitting element 1 according to the first embodiment. In FIG. 11A, white squares show the measurement results of the light emitting element samples in the first comparative example in which the aluminum composition ratio peaks in the second barrier layers 82 were not located on the first light emitting part 21 side, but were located on the second p-side nitride semiconductor layer 43 side. The light emitting element samples in the first comparative example were produced to have the same structure as the light emitting element 1 of the first embodiment except for the difference in the second barrier layers 82. The light emitting element samples in the first comparative example were also produced such that the thickness of the first layer 82a in each second barrier layer 82 was varied to be 0.1 nm, 0.3 nm, 0.5 nm, and 1 nm.

The results in FIG. 11A show that the forward voltage of the sample of light emitting element 1 according to the first embodiment where the first layers 82a were 0.5 nm in thickness was lower than those of the sample without first layers 82a and the first comparative example sample where the first layers 82a were 0.5 nm in thickness. Moreover, the forward voltage of the sample of the light emitting element 1 according to the first embodiment where the first layers 82a were 1 nm in thickness was lower than that of the sample without first layers 82a, but similar to that of the first comparative example sample where the first layers 82a were 1 nm in thickness.

Figure 11B:
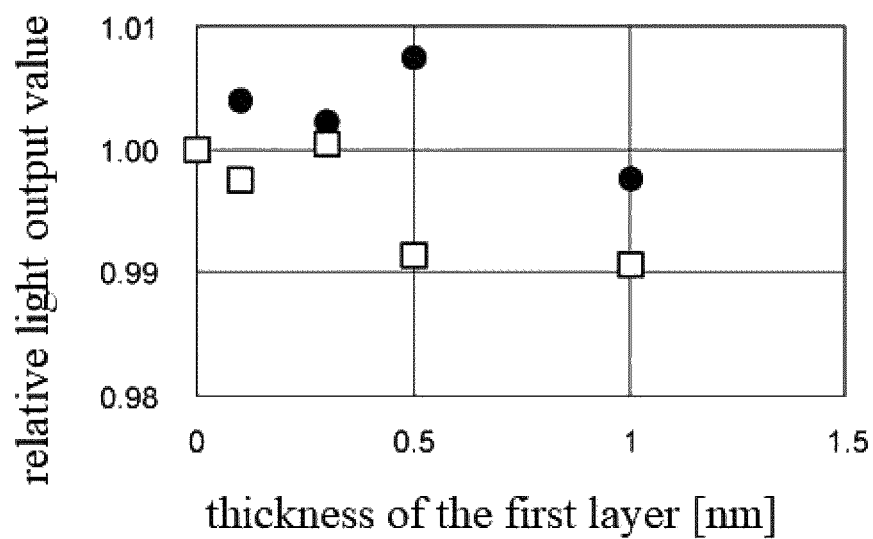
FIG. 11B is a graph showing the light output measurement results of the light emitting elements according to the first embodiment.

FIG. 11B is a graph showing the light output measurement results of the samples of the light emitting element 1 when the forward current applied was 120 mA. In FIG. 11B, the horizontal axis represents the thickness (nm) of the first layer 82a in a second barrier layer 82. In FIG. 11B, the vertical axis represents the relative light output value as compared to the light output (1.00) assumed in the case in which the first layers 82a were zero in thickness.

In FIG. 11B, black circles show the measurement results of the samples of the light emitting element 1 according to the first embodiment. In FIG. 11B, white squares show the measurement results of the light emitting element samples in the first comparative example described above.

The results in FIG. 11B show that the light outputs of the samples of the light emitting element 1 according to the first embodiment where the first layers 82a were 0.1 nm, 0.3 nm, 0.5 nm, and 1 nm in thickness were higher than the sample without first layers 82a and all of the light emitting element samples in the first comparative example. Accordingly, the first layers 82a are preferably 0.1 nm to 1 nm in thickness in order to increase the light output. Furthermore, considering together the results shown in FIG. 11A, the first layers 82a are preferably 0.5 nm to 1 nm in thickness in order to increase the light output while lowering the forward voltage.

Figure 6:
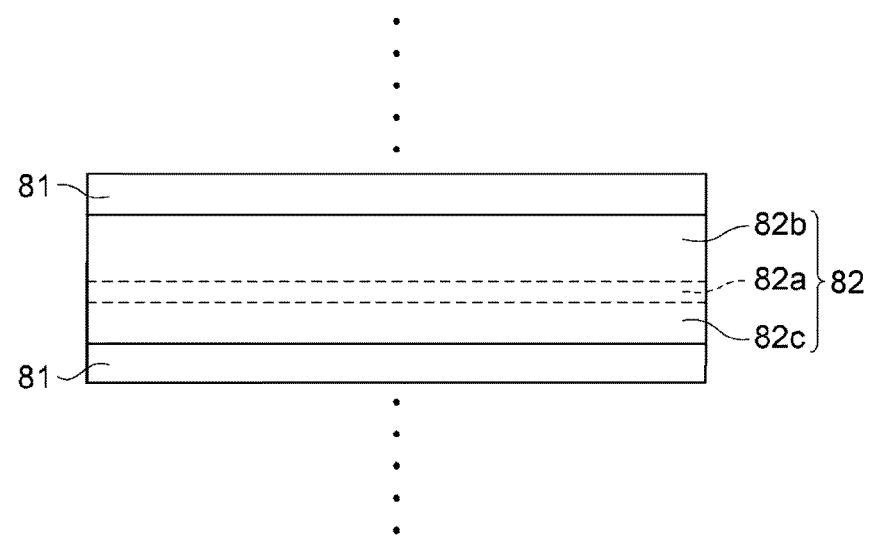
FIG. 6 is a cross-sectional view of a portion of the second active layer of a variation of the first embodiment.

As shown in FIG. 6, a second barrier layer 82 can further have a third layer 82c that is positioned closer to the first light emitting part 21 than the first layer 82a is. FIG. 6 is a cross-sectional view of a portion of the second active layer 80 in a variation of the first embodiment. FIG. 6 shows two adjacent second well layers 81 and the second barrier layer 82 interposed between the second well layers 81.

A second barrier layer 82 can be formed on a second well layer 81 by forming a third layer 82c on the second well layer 81, forming a first layer 82a on the third layer 82c, and forming a second layer 82b on the first layer 82a. For example, a second barrier layer 82 is formed by forming an undoped GaN layer as a third layer 82c, forming an undoped AlGaN layer as a first layer 82a on the third layer 82c, and forming an undoped GaN layer as a second layer 82b on the first layer 82a. Providing a third layer 82c can reduce the internal electric field generated at the interface between the second well layer 81 and the second barrier layer 82, thereby increasing the emission efficiency. The aluminum composition ratio of the second layer 82b and the aluminum composition ratio of the third layer 82c are lower than the aluminum composition ratio of the first layer 82a. The third layer 82c is smaller in thickness than the second layer 82b. The thickness of the third layer 82c can be set in a range of 0.1 nm to 1 nm.

Second Embodiment

Figure 7:
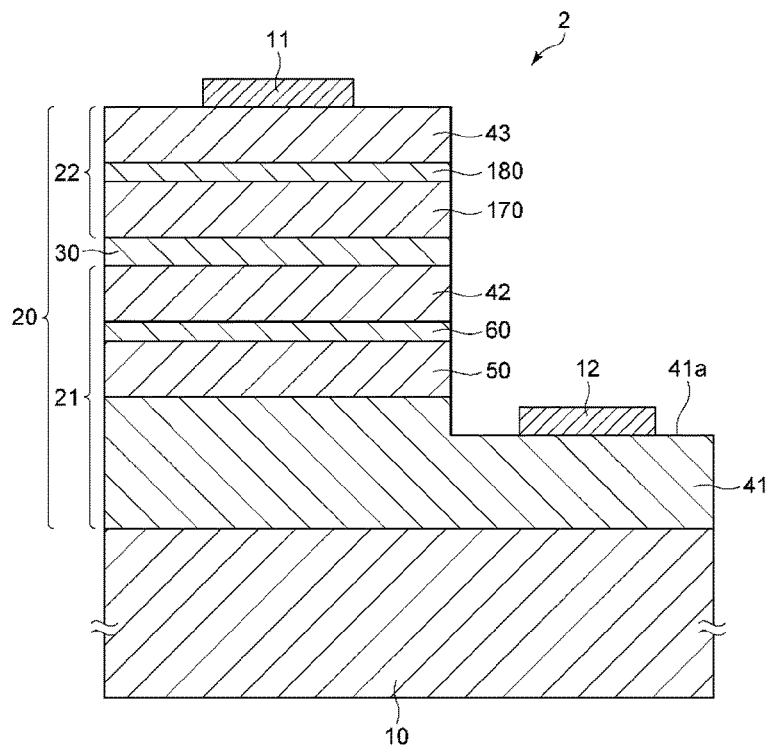
FIG. 7 is a cross-sectional view of a light emitting element according to a second embodiment.

FIG. 7 is a cross-sectional view of a light emitting element 2 according to a second embodiment.

Figure 8:
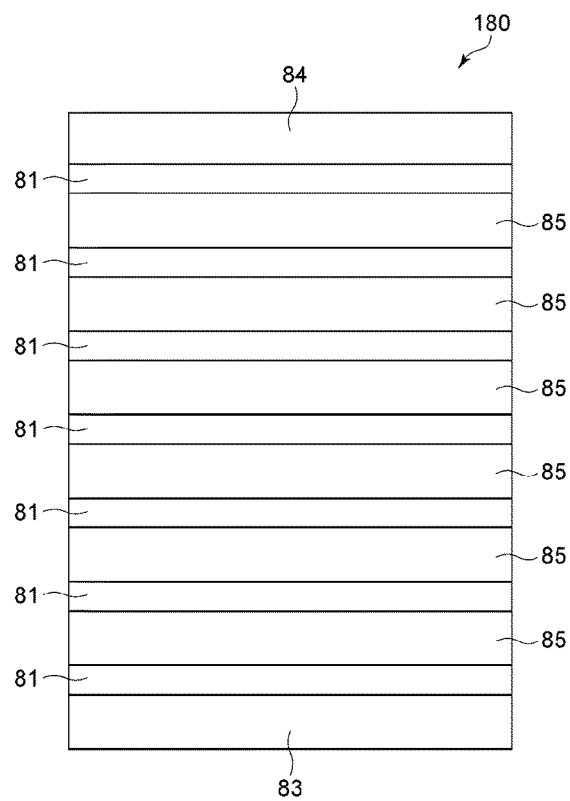
FIG. 8 is a cross-sectional view of a second active layer according to the second embodiment.

FIG. 8 is a cross-sectional view of a second active layer 180 of the second embodiment.

Figure 9:
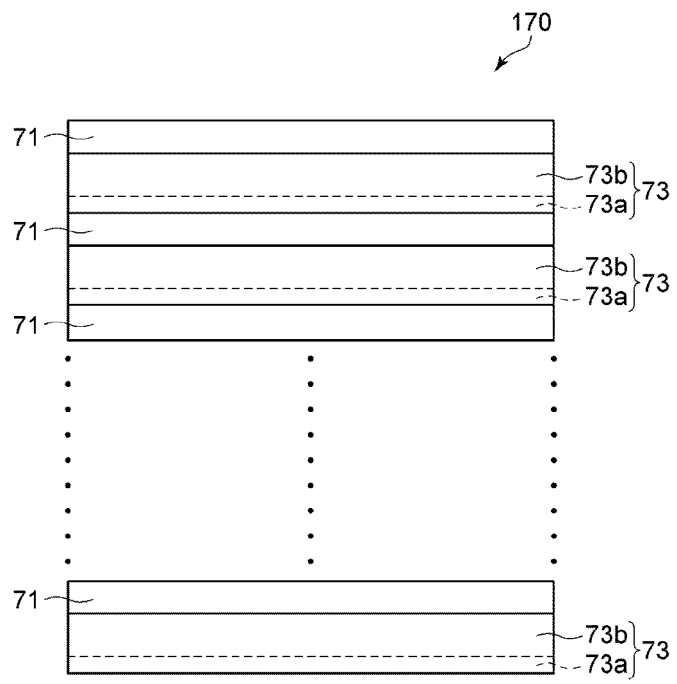
FIG. 9 is a cross-sectional view of a second superlattice layer according to the second embodiment.

FIG. 9 is a cross-sectional view of a second superlattice layer 170 of the second embodiment.

In a light emitting element 2 according to the second embodiment, the second active layer and the second superlattice layer are different from the light emitting element 1 according to the first embodiment.

Second Active Layer

As shown in FIG. 8, a second active layer 180 has a plurality of second well layers 81 and at least one second barrier layer 85. The second active layer 180 has, for example, three or more second well layers 81 and two or more second barrier layers 85. The second active layer 180 can have, for example, seven second well layers 81 and six second barrier layers 85. Each second barrier layer 85 is interposed between two adjacent second well layers 81 among the second well layers 81. Furthermore, the second active layer 180 can have a sixth barrier layer 83 positioned lowest in the second active layer 180 and a third barrier layer 84 positioned highest in the second active layer 180. A second well layer 81 is interposed between the second barrier layer 85 positioned lowest among the second barrier layers 85 and the sixth barrier layer 83. A second well layer 81 is interposed between the second barrier layer 85 positioned highest among the second barrier layers 85 and the third barrier layer 84. Between the sixth barrier layer 83 and the third barrier layer 84, the second well layers 81 and the second barrier layers 85 are alternately provided.

The band gaps of the second barrier layers 85, the sixth barrier layer 83, and the third barrier layer 84 are larger than the band gaps of the second well layers 81. For the materials for the second well layers 81, the same materials as those for the first well layers 61 in the first embodiment can be used. For the materials for the sixth barrier layer 83 and the third barrier layer 84, the same materials as those for the first barrier layers 65 in the first embodiment can be used.

In the second active layer 180 of the second embodiment, a portion of each second barrier layer 85 on the first light emitting part 21 side does not contain aluminum, and the second barrier layers 85 are, for, example, undoped GaN layers. The second barrier layers 85 are larger in thickness than the second well layers 81. For example, the thickness of each second barrier layer 85 may be set in a range of 3 nm to 5 nm.

Second Superlattice Layer

As shown in FIG. 9, a second superlattice layer 170 has a plurality of third nitride semiconductor layers 71 and a plurality of fourth nitride semiconductor layers 73. The second superlattice layer 170 can have, for example, 15 to 25 pairs of a third nitride semiconductor layer 71 and a fourth nitride semiconductor layer 73. The second superlattice layer 170 can have, for example, twenty third nitride semiconductor layers 71 and twenty fourth nitride semiconductor layers 73. In the second superlattice layer 170, a fourth nitride semiconductor layer 73 is in the lowest position (the lowermost layer), and a third nitride semiconductor layer 71 is in the highest position (the uppermost layer). From the fourth nitride semiconductor layer 73, the lowermost layer, to the third nitride semiconductor layer 71, the uppermost layer, the fourth nitride semiconductor layers 73 and the third nitride semiconductor layers 71 are formed alternately.

The fourth nitride semiconductor layers 73 include a fourth nitride semiconductor layer 73 interposed between two third nitride semiconductor layers 71 among the third nitride semiconductor layers 71. A fourth nitride semiconductor layer 73 is also provided between the third nitride semiconductor layer 71 that is the lowermost layer and the tunnel junction part 30.

For the materials for the third nitride semiconductor layers 71, the same materials as those used in the first embodiment can be used. For example, the third nitride semiconductor layers 71 are silicon-doped InGaN layers. The n-type impurity concentration of the third nitride semiconductor layers 71 can be set in a range of $1 \times 10^{17}$ cm$^3$ to $1 \times 10^{20}$ cm$^3$.

The composition of a fourth nitride semiconductor layer 73 differs from the composition of a third nitride semiconductor layer 71. The fourth nitride semiconductor layers 74 contain aluminum and gallium, and have a higher aluminum composition ratio than the aluminum composition ratio of the second nitride semiconductor layers 52 of the first superlattice layer 50 in the first light emitting part 21. The aluminum composition ratio peak in at least one of the fourth nitride semiconductor layers 73 is located on the first light emitting part 21 side. The aluminum composition ratio peak is preferably on the first light emitting part 21 side in all fourth nitride semiconductor layers 73.

The fourth nitride semiconductor layers 73 are, for example, silicon-doped n-type nitride semiconductor layers.

The silicon concentration of the fourth nitride semiconductor layers 73 can be set, for example, to $1 \times 10^{17}$ cm$^3$ to $1 \times 10^{20}$ cm$^3$.

At least one of the fourth nitride semiconductor layers 73 has, successively from the tunnel junction part 30 side, a fourth layer 73a and a fifth layer 73b. All fourth nitride semiconductor layers 73 preferably have a fourth layer 73a and a fifth layer 73b. A fourth nitride semiconductor layer 73 is formed by forming a fourth layer 73a, followed by forming a fifth layer 73b on the fourth layer 73a. For example, a fourth nitride semiconductor layer 73 is formed by forming an AlGaN layer as a fourth layer 73a, followed by forming a GaN layer as a fifth layer 73b on the fourth layer 73a. The aluminum composition ratio of a fourth layer 73a is higher than the aluminum composition ratio of a fifth layer 73b. The aluminum composition ratio peak in a fourth nitride semiconductor layer 73 is located in the fourth layer 73a. The aluminum composition ratio of a fourth layer 73a can be set in a range of 3% to 5%.

The fourth nitride semiconductor layers 73 are smaller in thickness than the third nitride semiconductor layers 71. For example, the thickness of a third nitride semiconductor layer 71 can be set in a range of 0.5 nm to 1.5 nm. The thickness of a fourth nitride semiconductor layer 73 can be set in a range of 1.5 nm to 3 nm.

According to the second embodiment, the fourth nitride semiconductor layers 73 in the second superlattice layer 170 of the second light emitting part 22 contain aluminum at a higher composition ratio than that of the second nitride semiconductor layers 52 in the first superlattice layer 50 of the first light emitting part 21. Forming the fourth nitride semiconductor layers 73 containing aluminum allows aluminum to be incorporated into V-pits with priority to initiate crystal growth in V-pits thereby readily filling V-pits to improve the flatness without having to increase the growth temperature. This can also improve the flatness of the second active layer 180 formed on the second superlattice layer 170, increasing the region of the second active layer 180 that contributes to emission, thereby improving the emission efficiency of the light emitting element 2.

Increasing the aluminum composition ratio of the second nitride semiconductor layers 52 of the first superlattice layer 50 on the first light emitting part 21 side, which is less prone to flatness degradation than the second light emitting part 21 side, does not tend to lead to any increase in the emission efficiency of the light emitting element 2. This is believed to be because the flattening effect on the second nitride semiconductor layers 52, although achieved to some extent, is less than that achieved on the second light emitting part 22 side, and the increased band gaps of the second nitride semiconductor layers 52 reduce the emission efficiency.

Next, the forward voltage and light output measurement results of the samples of the light emitting element 2 according to the second embodiment will be explained. The thickness of the fourth layer 73a in each second barrier layer 82 that included a fourth layer 73a and a fifth layer 73b was varied among samples to be 0.1 nm, 0.3 nm, and 0.5 nm to measure their forward voltages and light outputs.

Each of the samples of the light emitting element 2 had the constituents described below.

The substrate 10 was a sapphire substrate.

The n-side nitride semiconductor layer 41 contained silicon as a n-type impurity. The silicon concentration of the n-side nitride semiconductor layer 41 was about $1 \times 10^{19}$ cm$^3$. The silicon concentration of the n-side nitride semiconductor layer 41 refers to the highest silicon concentration in the n-side nitride semiconductor layer 41. The thickness of the n-side nitride semiconductor layer 41 was about 5 μm.

The first superlattice layer 50 had twenty first nitride semiconductor layers 51 and twenty second nitride semiconductor layers 52. The first nitride semiconductor layers 51 were undoped InGaN layers. The In composition ratio of each InGaN layer was about 7%. The first nitride semiconductor layer 51 were about 1 nm in thickness. The second nitride semiconductor layers 52 were undoped GaN layers. The second nitride semiconductor layers 52 were about 2 nm in thickness.

The first active layer 60 had seven first well layers 61 and six first barrier layers 65. The first active layer 60 further had a fourth barrier layer 63 positioned lowest in the first active layer 60, and a fifth barrier layer 64 positioned highest in the first active layer 60. The first well layers 61 were undoped InGaN layers. The In composition ratio of each first well layer 61 was about 15%. The first well layers 61 were about 3.5 nm in thickness. The first barrier layers 65 were undoped GaN layers. The first barrier layers 65 were about 4 nm in thickness. The fourth barrier layer 63 included, successively from the first superlattice layer 50 side, a silicon-doped InGaN layer and an undoped GaN layer. The thickness of the fourth barrier layer 63 was about 3.5 nm. The fifth barrier layer 64 was an undoped GaN layer. The thickness of the fifth barrier layer 64 was about 4 nm.

The first p-side nitride semiconductor layer 42 contained magnesium as a p-type impurity. The magnesium concentration of the first p-side nitride semiconductor 42 was about $5 \times 10^{20}$ cm$^3$. The magnesium concentration of the first p-side nitride semiconductor 42 refers to the highest magnesium concentration in the first p-side nitride semiconductor 42. The thickness of the first p-side nitride semiconductor 42 was about 80 nm.

The tunnel junction part 30 included a silicon-doped n-type GaN layer. The silicon concentration of the n-type GaN layer was about $5 \times 10^{20}$ cm$^3$. The thickness of the n-type GaN layer was about 150 nm.

The second superlattice layer 70 had twenty third nitride semiconductor layers 71 and twenty fourth nitride semiconductor layers 73. The third nitride semiconductor layers 71 were silicon-doped InGaN layers. The In composition ratio of each third nitride semiconductor layer 71 was about 7%. The third nitride semiconductor layers 71 were about 1 nm in thickness. Each fourth nitride semiconductor layer 73 had a fourth layer 73a and a fifth layer 73b. The fourth layers 73a were silicon-doped AlGaN layers. The Al composition ratio of each fourth layer 73a was about 4%. The fifth layers 73b were silicon-doped GaN layers. The fourth nitride semiconductor layers 73 were about 2 nm in thickness. The thicknesses of the fourth layers 73a were varied among samples to be 0.1 nm, 0.3 nm, and 0.5 nm. The silicon concentration of each of the third nitride semiconductor layers 71 and the fourth nitride semiconductor layers 73 was about $1 \times 10^{19}$ cm$^3$.

The second active layer 180 had seven second well layers 81 and six second barrier layers 85. The second active layer 180 further had a sixth barrier layer 83 that was positioned lowest in the second active layer 180, and a third barrier layer 84 that was positioned highest in the second active layer 180. The second well layers 81 were undoped InGaN layers. The In composition ratio of each second well layer 81 was about 15%. The second well layers 81 were about 3.5 nm in thickness. The second barrier layers 85 were undoped GaN layers. The second barrier layers 85 were about 4 nm in thickness. The sixth barrier layer 83 included, successively from the second superlattice layer 70 side, a silicon-doped InGaN layer and an undoped GaN layer. The thickness of the sixth barrier layer 83 was about 3.5 nm. The third barrier layer 84 was an undoped GaN layer. The thickness of the third barrier layer 84 was about 4 nm.

The second p-side nitride semiconductor layer 43 contained magnesium as a p-type impurity. The magnesium concentration of the second p-side nitride semiconductor layer 43 was about $5 \times 10^{20}$ cm$^3$. The magnesium concentration of the second p-side nitride semiconductor layer 43 refers to the highest magnesium concentration in the second p-side nitride semiconductor layer 43. The thickness of the second p-side nitride semiconductor layer 43 was about 100 nm.

Figure 12A:
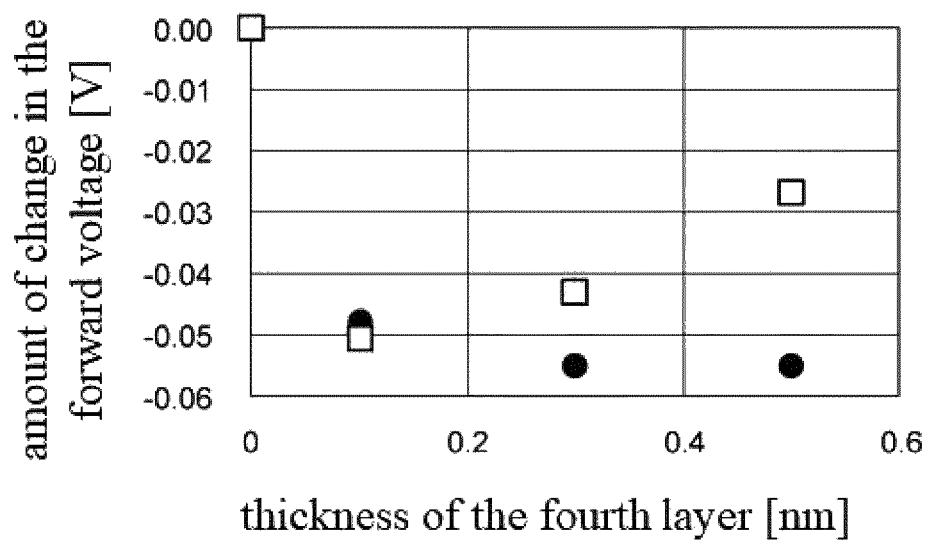
FIG. 12A is a graph showing the forward voltage measurement results of the light emitting elements according to the second embodiment.

FIG. 12A is a graph showing the forward voltage measurement results of the samples of the light emitting element 2 when the forward current applied was 120 mA. In FIG. 12A, the horizontal axis represents the thickness (nm) of the fourth layer 73a in a fourth nitride semiconductor layer 73. In FIG. 12A, the vertical axis represents the amount of change in the forward voltage (V) as compared to the forward voltage (0.00 V) assumed in the case in which the thickness of a fourth layer 73a was zero. The thickness of a fourth layer 73a being zero is the case in which the fourth nitride semiconductor layers 73 were composed only of GaN layers.

In FIG. 12A, black circles show the measurement results of the samples of the light emitting element 2 according to the second embodiment. In FIG. 12A, white squares show the measurement results of the light emitting element samples in the second comparative example in which the aluminum composition ratio peaks in the fourth nitride semiconductor layers 73 were not located on the tunnel junction part 30 side, but were located on the second active layer 180 side. The light emitting element samples in the second comparative example were made to have the same structure as the light emitting element 2 of the second embodiment except for the difference in the fourth nitride semiconductor layers 73. The light emitting element samples in the second comparative example were also produced such that the thickness of the fourth layer 73a in each fourth nitride semiconductor layer 73 was varied to be 0.1 nm, 0.3 nm, and 0.5 nm.

The results in FIG. 12A show that the forward voltages of the samples of light emitting element 2 according to the second embodiment where the fourth layers 73a were 0.3 nm and 0.6 nm in thickness were lower than those of the sample without fourth layers 73a and the second comparative example samples where the fourth layers 73a were 0.3 nm and 0.5 nm in thickness. Moreover, the forward voltage of the sample of the light emitting element 2 according to the second embodiment where the fourth layers 73a were 0.1 nm in thickness was lower than the sample without fourth layers 73a, but was similar to the sample in the second comparative example where the fourth layers 73a were 0.1 nm in thickness.

Figure 12B:
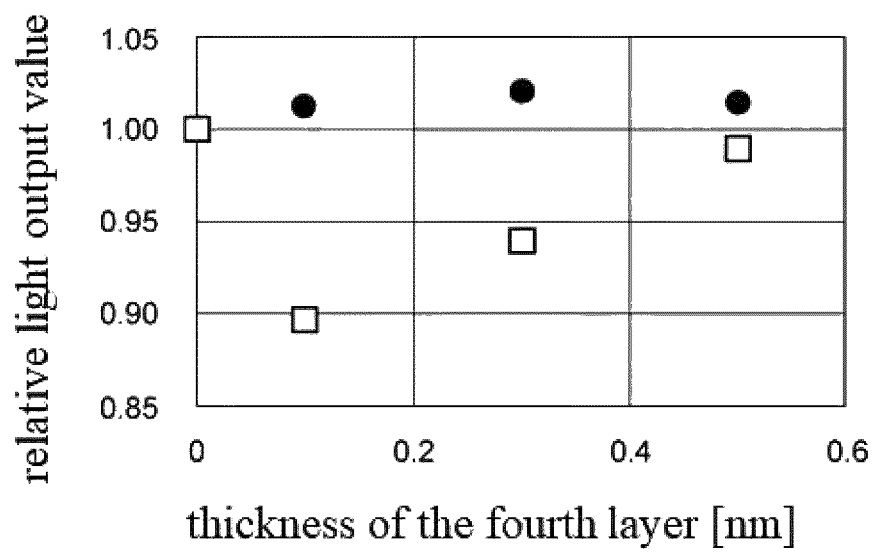
FIG. 12B is a graph showing the light output measurement results of the light emitting elements according to the second embodiment.

FIG. 12B is a graph showing the light output measurement results of the samples of the light emitting element 2 when the forward current applied was 120 mA. In FIG. 12B, the horizontal axis represents the thickness (nm) of the fourth layer 73a in a fourth nitride semiconductor layer 73. In FIG. 12B, the vertical axis represents the relative light output value as compared to the light output (1.00) assumed in the case in which the thickness of a fourth layer 73a was zero.

In FIG. 12B, black circles show the measurement results of the samples of the light emitting element 2 according to the second embodiment. In FIG. 12B, white squares show the measurement results of the light emitting element samples in the second comparative example.

The results in FIG. 12B show that the light outputs of the samples of the light emitting element 2 according to the second embodiment where the fourth layers 73a were 0.1 nm, 0.3 nm, and 0.5 nm in thickness were higher than the sample without fourth layers 73a and all of the light emitting element samples in the second comparative example. Accordingly, the fourth layers 73a are preferably 0.1 nm to 0.5 nm in thickness in order to increase the light output. Furthermore, considering together the results shown in FIG. 12A, the fourth layers 73a are preferably 0.3 nm to 0.5 nm in thickness in order to increase the light output while lowering the forward voltage.

Third Embodiment

Figure 10:
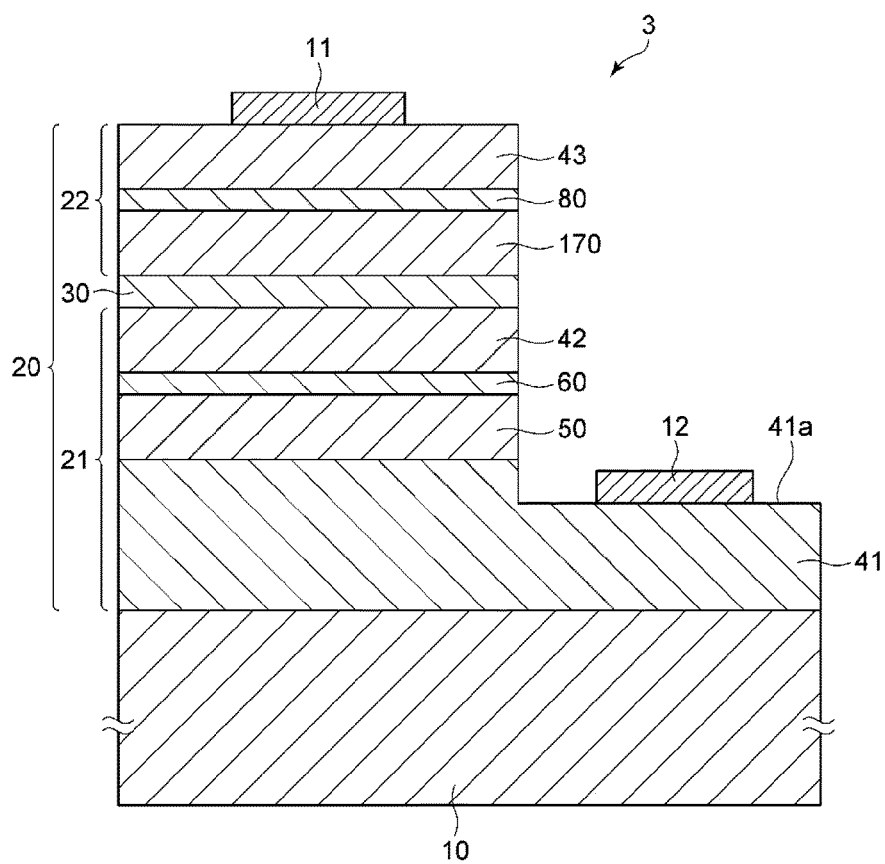
FIG. 10 is a cross-sectional view of a light emitting element according to a third embodiment.

FIG. 10 is a cross-sectional view of a light emitting element 3 according to a third embodiment.

A light emitting element 3 according to a third embodiment includes as a second active layer the second active layer 80 of the first embodiment and as a second superlattice layer the second superlattice layer 170 of the second embodiment. Accordingly, the light emitting element 3 according to the third embodiment can achieve the effect of the second active layer 80 of the first embodiment as well as the effect of the second superlattice layer 170 of the second embodiment.

In the foregoing, certain embodiments of the present invention have been explained with reference to specific examples. The present invention, however, is not limited to these specific examples. All forms implementable by a person skilled in the art by suitably making design changes based on any of the embodiments of the present invention described above also fall within the scope of the present invention so long as they encompass the subject matter of the present invention. Furthermore, various modifications and alterations within the spirit of the present invention that could have been made by a person skilled in the art also fall within the scope of the present invention.

What is claimed is:
1. A light emitting element comprising:
   successively from a lower side to an upper side:
      a first light emitting part having a first active layer,
      a tunnel junction part, and
      a second light emitting part having a second active layer; wherein:
   the first active layer comprises a plurality of first well layers, and a first barrier layer positioned between two adjacent first well layers among the plurality of first well layers, wherein a band gap of the first active layer is larger than band gaps of the first well layers;
   the second active layer comprises a plurality of second well layers, and a second barrier layer positioned between two adjacent second well layers among the plurality of second well layers, wherein a band gap of the second active layer is larger than band gaps of the second well layers;
   the second barrier layer comprises a nitride semiconductor layer containing aluminum and gallium and having an aluminum composition ratio higher than an aluminum composition ratio of the first barrier layer; and
   an aluminum composition ratio peak of the second barrier layer is located on a first light emitting part side of the second barrier layer.
2. The light emitting element according to claim 1, wherein:

the second barrier layer comprises, successively from the first light emitting part side, a first layer, and a second layer;
the aluminum composition ratio peak in the second barrier layer is located in the first layer; and
a thickness of the first layer is in a range of 2% to 25% of a thickness of the second barrier layer.

3. The light emitting element according to claim 2, wherein:
the thickness of the first layer is within a range of 0.1 nm to 1 nm.

4. The light emitting element according to claim 2, wherein:
an aluminum composition ratio of the first layer is in a range of 3% to 5%.

5. The light emitting element according to claim 3, wherein:
an aluminum composition ratio of the first layer is in a range of 3% to 5%.

6. The light emitting element according to claim 2, wherein:
the second barrier layer further comprises a third layer positioned closer to the first light emitting part than is the first layer; and
an aluminum composition ratio of the second layer and an aluminum composition ratio of the third layer are lower than an aluminum composition ratio of the first layer.

7. The light emitting element according to claim 3, wherein:
the second barrier layer further comprises a third layer positioned closer to the first light emitting part than is the first layer; and
an aluminum composition ratio of the second layer and an aluminum composition ratio of the third layer are lower than an aluminum composition ratio of the first layer.

8. The light emitting element according to claim 4, wherein:
the second barrier layer further comprises a third layer positioned closer to the first light emitting part than is the first layer; and
an aluminum composition ratio of the second layer and an aluminum composition ratio of the third layer are lower than an aluminum composition ratio of the first layer.

9. The light emitting element according to claim 1, wherein:
the second light emitting part further comprises a superlattice layer positioned between the second active layer and the tunnel junction part;
the superlattice layer comprises a plurality of first nitride semiconductor layers, and a second nitride semiconductor layer positioned between two adjacent first nitride semiconductor layers among the plurality of first nitride semiconductor layers;
the second nitride semiconductor layer contains aluminum and gallium; and
an aluminum composition ratio peak in the second nitride semiconductor layer is located on a first light emitting part side of the second nitride semiconductor layer.

10. The light emitting element according to claim 2, wherein:
the second light emitting part further comprises a superlattice layer positioned between the second active layer and the tunnel junction part;
the superlattice layer comprises a plurality of first nitride semiconductor layers, and a second nitride semiconductor layer positioned between two adjacent first nitride semiconductor layers among the plurality of first nitride semiconductor layers;
the second nitride semiconductor layer contains aluminum and gallium; and
an aluminum composition ratio peak in the second nitride semiconductor layer is located on a first light emitting part side of the second nitride semiconductor layer.

11. The light emitting element according to claim 3, wherein:
the second light emitting part further comprises a superlattice layer positioned between the second active layer and the tunnel junction part;
the superlattice layer comprises a plurality of first nitride semiconductor layers, and a second nitride semiconductor layer positioned between two adjacent first nitride semiconductor layers among the plurality of first nitride semiconductor layers;
the second nitride semiconductor layer contains aluminum and gallium; and
an aluminum composition ratio peak in the second nitride semiconductor layer is located on a first light emitting part side of the second nitride semiconductor layer.

12. The light emitting element according to claim 9, wherein:
the first nitride semiconductor layers and the second nitride semiconductor layer contain an n-type impurity.

13. The light emitting element according to claim 10, wherein:
the first nitride semiconductor layers and the second nitride semiconductor layer contain an n-type impurity.

14. The light emitting element according to claim 1, wherein:
the second active layer comprises three or more second well layers and two or more second barrier layers; and
aluminum composition ratio peaks in all of the second barrier layers are located on first light emitting part sides of the second barrier layers.

15. The light emitting element according to claim 2, wherein:
the second active layer comprises three or more second well layers and two or more second barrier layers; and
aluminum composition ratio peaks in all of the second barrier layers are located on first light emitting part sides of the second barrier layers.

16. The light emitting element according to claim 3, wherein:
the second active layer comprises three or more second well layers and two or more second barrier layers; and
aluminum composition ratio peaks in all of the second barrier layers are located on first light emitting part sides of the second barrier layers.

17. The light emitting element according to claim 14, wherein:
the second active layer further comprises a third barrier layer positioned highest in the second active layer; and
an aluminum composition ratio of the third barrier layer is lower than aluminum composition ratios of the second barrier layers.

18. The light emitting element according to claim 15, wherein:
the second active layer further comprises a third barrier layer positioned highest in the second active layer, and
an aluminum composition ratio of the third barrier layer is lower than aluminum composition ratios of the second barrier layers.

19. The light emitting element according to claim 16, wherein:

the second active layer further comprises a third barrier layer positioned highest in the second active layer, and an aluminum composition ratio of the third barrier layer is lower than aluminum composition ratios of the second barrier layers.

20. A light emitting element comprising:

successively from a lower side to an upper side:
- a first light emitting part having a first active layer;
- a tunnel junction part; and
- a second light emitting part having a second active layer: wherein:

the first light emitting part comprises a first superlattice layer positioned under the first active layer and comprising:
- a plurality of first nitride semiconductor layers, and
- a second nitride semiconductor layer positioned between two adjacent first nitride semiconductor layers among the plurality of first nitride semiconductor layers;

the second light emitting part comprises a second superlattice layer positioned between the second active layer and the tunnel junction part and comprising:
- a plurality of third nitride semiconductor layers, and
- a fourth nitride semiconductor layer positioned between two adjacent third nitride semiconductor layers among the plurality of third nitride semiconductor layers;

the fourth nitride semiconductor layer contains aluminum and gallium, and has an aluminum composition ratio that is higher than an aluminum composition ratio of the second nitride semiconductor layer; and an aluminum composition ratio peak of the fourth nitride semiconductor layer is located on a first light emitting part side of the fourth nitride semiconductor layer.

* * * * *